United States Patent
Frey et al.

(10) Patent No.: US 9,721,871 B2
(45) Date of Patent: Aug. 1, 2017

(54) HEAT EXCHANGER METHODS, APPARATUSES AND SYSTEMS WITH A MANIFOLD STRUCTURE

(71) Applicant: Intel Corporation, Santa Clara, CA (US)

(72) Inventors: Emery E. Frey, Portland, OR (US); Eric D. McAfee, Portland, OR (US); Shankar Krishnan, Portland, OR (US); Juan G. Cevallos, Portland, OR (US); Roger D. Flynn, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/958,420

(22) Filed: Dec. 3, 2015

(65) Prior Publication Data

US 2017/0162475 A1   Jun. 8, 2017

(51) Int. Cl.
| | | |
|---|---|---|
| *H01L 23/473* | (2006.01) | |
| *H01L 23/34* | (2006.01) | |
| *H01L 23/40* | (2006.01) | |
| *H01L 23/28* | (2006.01) | |
| *H01L 23/367* | (2006.01) | |

(Continued)

(52) U.S. Cl.
CPC ............ *H01L 23/473* (2013.01); *B23P 15/26* (2013.01); *G06F 1/20* (2013.01); *H01L 21/4882* (2013.01); *H01L 23/28* (2013.01); *H01L 23/34* (2013.01); *H01L 23/36* (2013.01); *H01L 23/3672* (2013.01); *H01L 23/3675* (2013.01); *H01L 23/3677* (2013.01); *H01L 23/40* (2013.01); *H01L 23/44* (2013.01); *H01L 23/46* (2013.01); *H01L 24/17* (2013.01); *H01L 24/32* (2013.01); *H01L 24/73* (2013.01); *H01L 2224/16225* (2013.01); *H01L 2224/32245* (2013.01); *H01L 2224/73253* (2013.01); *H01L 2924/01028* (2013.01); *H01L 2924/01029* (2013.01); *H01L 2924/01046* (2013.01);

(Continued)

(58) Field of Classification Search
CPC ............ H01L 23/3672; H01L 23/3675; H01L 23/3677; H01L 23/34; H01L 23/36; H01L 23/28; H01L 23/40; H01L 23/44; H01L 23/46; H01L 23/42; H01L 23/473
See application file for complete search history.

(56) References Cited

U.S. PATENT DOCUMENTS

| 2014/0138815 A1* | 5/2014 | Yee ..................... H01L 25/16 257/737 |
| 2016/0143189 A1* | 5/2016 | Campbell .............. B29C 70/84 165/185 |

* cited by examiner

*Primary Examiner* — Thanhha Pham
(74) *Attorney, Agent, or Firm* — Schwabe, Williamson & Wyatt, P.C.

(57) ABSTRACT

Methods, apparatuses and systems associated with a heat exchanger for cooling an IC package are disclosed herein. In embodiments, a heat exchanger may include a base plate having a bottom side to be thermally coupled to the IC package, and a fin side, wherein the fin side is to include a plurality of fins to dissipate thermal energy emanated from the IC package. The heat exchanger may further include a manifold structure disposed on top of the base plate, having one or more layers, to regulate a coolant fluid flow to cool the plurality of fins, wherein the one or more layers are to include a plurality of channels and ports complementarily organized to distribute the coolant fluid flow to the plurality of fins tailored to a thermal energy emanation pattern of the integrated circuit package. Other embodiments may be described and/or claimed.

18 Claims, 6 Drawing Sheets

(51) Int. Cl.
*H01L 23/46* (2006.01)
*B23P 15/26* (2006.01)
*G06F 1/20* (2006.01)
*H01L 21/48* (2006.01)
*H01L 23/00* (2006.01)
*H01L 23/36* (2006.01)
*H01L 23/44* (2006.01)

(52) U.S. Cl.
CPC ............... *H01L 2924/01047* (2013.01); *H01L 2924/01079* (2013.01); *H01L 2924/1432* (2013.01)

HEAT EXCHANGER METHODS, APPARATUSES AND SYSTEMS WITH A MANIFOLD STRUCTURE

FIELD

Embodiments of the present disclosure generally relate to the field of integrated circuits. More specifically, embodiments of the present disclosure relate to heat exchanger methods, apparatuses and systems with a manifold structure to provide a coolant fluid flow to an integrated circuit package, tailored to a heat emanation pattern of the integrated circuit package.

BACKGROUND

Generally, the technology for liquid cooling of integrated circuit packages may use high density fin arrays and may include additional features integrated with the fin arrays. The additional features may include liquid pumps, which may make manufacturing of a fin system on a large scale expensive, may require filtration levels beyond what is economic for a large system, and may present a challenge from a reliability and solution height perspective. These types of liquid coolant heat exchangers also may present challenges for the integration of a centrally applied loading mechanism to mount the liquid coolant heat exchanger to an integrated circuit package, e.g., a multi-core processor. Interface quality and performance on the multi-core processor may be compromised.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Methods, apparatuses and systems associated with a heat exchanger for cooling an integrated circuit package are disclosed herein. In embodiments, a heat exchanger may include a base plate having a bottom side to be thermally coupled to the integrated circuit package, and a fin side opposite to the bottom side, wherein the fin side is to include a plurality of fins to dissipate thermal energy emanated from the integrated circuit package. The heat exchanger may further include a manifold structure disposed on top of the base plate, having one or more layers, to regulate a coolant fluid flow over the plurality of fins to cool the plurality of fins, wherein the layers are to include a plurality of channels and ports complementarily organized to distribute the coolant fluid flow to the plurality of fins tailored to a thermal energy emanation pattern of the integrated circuit package. Additionally, the heat exchanger may include a lid plate disposed on top of the manifold structure. Further, either the manifold structure or the lid plate may include an inlet port and an outlet port for provision and removal of the coolant fluid flow. Details of these and/or other embodiments, as well as some advantages and benefits, are disclosed and described herein.

In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "including," "having," and the like, as used with respect to embodiments of the present disclosure, are synonymous.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "metal" may refer to any number of metals including alloys of metals and metal-ceramic composites. When referring to a specific metal, such as copper, such reference includes alloys of the specific metal. As the case may be for copper or aluminum, this may include alloys of copper and alloys of aluminum.

Figure 1:
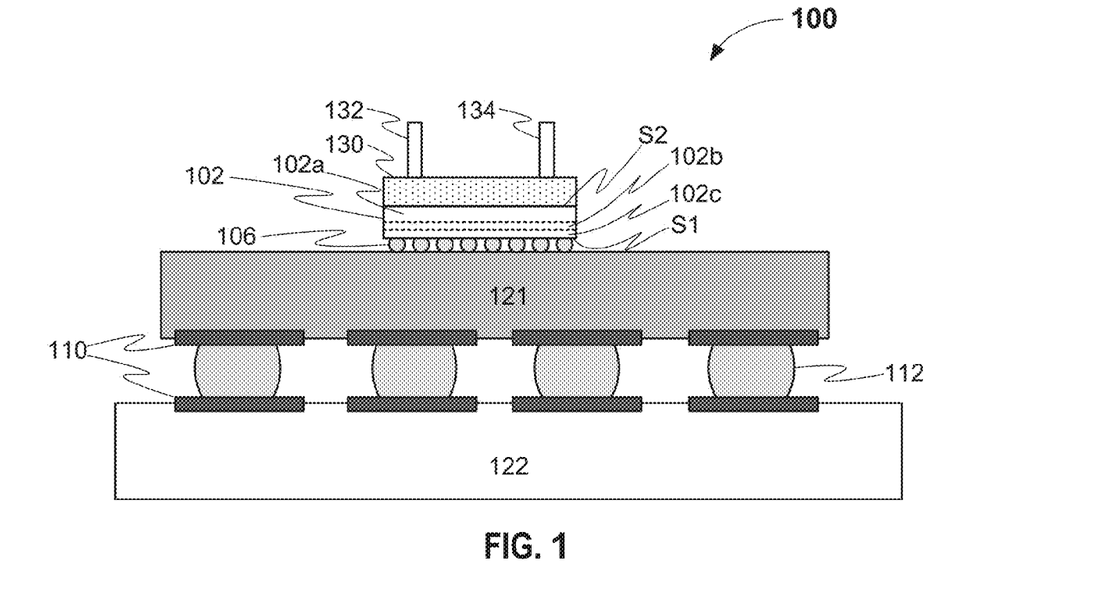
FIG. 1 schematically illustrates a cross-section side view of an integrated circuit (IC) assembly that includes a heat exchanger with a manifold structure of the present disclosure, in accordance with some embodiments.

Various embodiments of the heat exchangers described herein may allow for a reduction in the costs associated with manufacturing of liquid cooled electronic/computing apparatuses incorporating the heat exchangers. Additionally, various embodiments may reduce the overall height of a heat exchanger and, hence, reduce the overall height of an integrated circuit assembly having a heat exchanger mounted on an integrated circuit package. Furthermore, various embodiments may include a structural load path through the heat exchanger to provide improved mounting ability because the heat exchanger is not crushed or deformed by a mounting load, and no special process and/or device is required for mounting. In other words, the structural integrity of the heat exchanger, and layers within, is maintained even after application of a mounting load to the heat exchanger. Structural integrity means that there is no significant damage or deformation that may impact the performance of the heat exchanger. As described earlier, various embodiments of the heat exchanger may include a manifold structure with one or more layers having flow channels and ports to enable precise targeting of a coolant fluid flow tailored to various hot spot areas (thermal energy emanation sources) on an attached integrated circuit package. The manifold structure may allow an ability to tune the flow distribution and pressure drop of the heat exchanger independent of the fin structures of a heat sink disposed between the heat exchanger and the integrated circuit package. The flow may be tuned by optimizing the manifold structure's layers, and their flow channels and ports. For example, some embodiments may allow changing of a manifold structure layer's thickness, the flow channels geometry and/or sizes, and/or the ports' locations and/or sizes to control the pressure drop and flow balance to direct the coolant fluid flow to different regions of the heat exchanger thermally coupled with the heat sink. These advantages and benefits may be appreciated from the further description of the heat exchanger with a layered manifold structure having channels and ports, to follow. manifold structure FIG. 1 schematically illustrates a cross-section side view of an integrated circuit (IC) assembly 100 that includes a heat exchanger 130 of the present disclosure, in accordance with some embodiments. The IC assembly 100 may include a heat exchanger 130 physically and thermally coupled to one or more dies 102 (hereinafter "die 102"). During operation, dies 120 may generate thermal energy, which may be removed by the heat exchanger 130. The emanation of thermal energy from dies 102 may be uneven across the interfacing surface with the heat exchanger 130. That is, some areas of the interfacing surface may emanate more thermal energy (hot spots) than other areas. The heat exchanger 130 may be employed to direct a coolant fluid flow that is tailored to the thermal energy emanation pattern of the dies 102.

In embodiments, the heat exchanger may include an inlet 132 for a coolant fluid and an exit 134 for the coolant fluid. The heat exchanger 130 may be physically coupled to the die 102 by a thermal interface material (TIM). The heat exchanger 130 may be thermally and physically coupled to an inactive side S2 of the die 102. The die 102 may include an integrated heat spreader (not shown). The heat exchanger 130 may include an integrated heat spreader having a plurality of fins, and a manifold structure with layers having channels and ports to facilitate the targeted coolant fluid flow over the fins to remove heat from the heat sink/spreader absorbed from die 102.

In embodiments, the heat exchanger 130 may be coupled to the die 102, using a mechanical device and application of mechanical force, such as a clip, by way of example and not limitation. The layers of the heat exchanger 130 may include structural elements to individually contribute, and collectively provide structural support for the heat exchanger 130, to bear the force (also may be referred to as load) that may be applied to the heat exchanger 130, during the mounting process.

In some embodiments, the die 102 may be electrically and/or physically coupled with a substrate 121. In some embodiments, the substrate 121 may be electrically coupled with a circuit board 122, as can be seen. In some embodiments, an integrated circuit (IC) assembly 100 may include one or more of the die 102, substrate 121 and/or circuit board 122, according to various embodiments. The various embodiments described herein of heat exchangers 130 may be coupled to the one or more die 102 to cool the die 102. The various embodiments will be described in more detail later with references to FIG. 2 and FIG. 6, after a description of the die 102, the substrate 121 and circuit board 122.

The die 102 may represent a discrete product made from a semiconductor material (e.g., silicon) using semiconductor fabrication techniques such as thin film deposition, lithography, etching, and the like used in connection with forming complementary metal oxide semiconductor (CMOS) devices. In some embodiments, the die 102 may be, include, or be a part of a uni or multi-core processor, memory, system on chip (SoC), or application specific integrated circuit (ASIC).

The die 102 may be attached to the substrate 121 according to a wide variety of suitable configurations including, for example, being directly coupled with the substrate 121 in a flip-chip configuration, as depicted. In the flip-chip configuration, an active side, S1, of the die 102 including circuitry may be attached to a surface of the substrate 121 using die-level interconnect structures 106 such as bumps, pillars, pins, or other suitable structures that may also electrically couple the die 102 with the substrate 121. The die 102 may be coupled to substrate 121 via a socket on the substrate 121. Alternatively, the die 102 may be coupled directly to circuit board 122 via a socket on circuit board 122. The active side 51 of the die 102 may include active devices such as, for example, transistor devices. As earlier described and can be seen, an inactive side, S2, may be disposed opposite to the active side 51.

The die 102 may generally include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate. The device layer 102b may include, for example, transistor structures such as channel bodies and/or source/drain regions of transistor devices. The interconnect layer 102c may include interconnect structures (e.g., electrode terminals) that are configured to route electrical signals to or from the active devices in the device layer 102b. For example, the interconnect layer 102c may include horizontal lines (e.g., trenches) and/or vertical plugs (e.g., vias) or other suitable features to provide electrical routing and/or contacts.

Package-level interconnects such as, for example, solder balls 112 may be coupled to one or more pads (hereinafter "pads 110") on the substrate 121 and/or on the circuit board 122 to form corresponding solder joints that are configured to further route the electrical signals between the substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the substrate 121 with the circuit board 122 may be used in other embodiments.

The IC assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 100 may be used in some embodiments.

Figure 2:
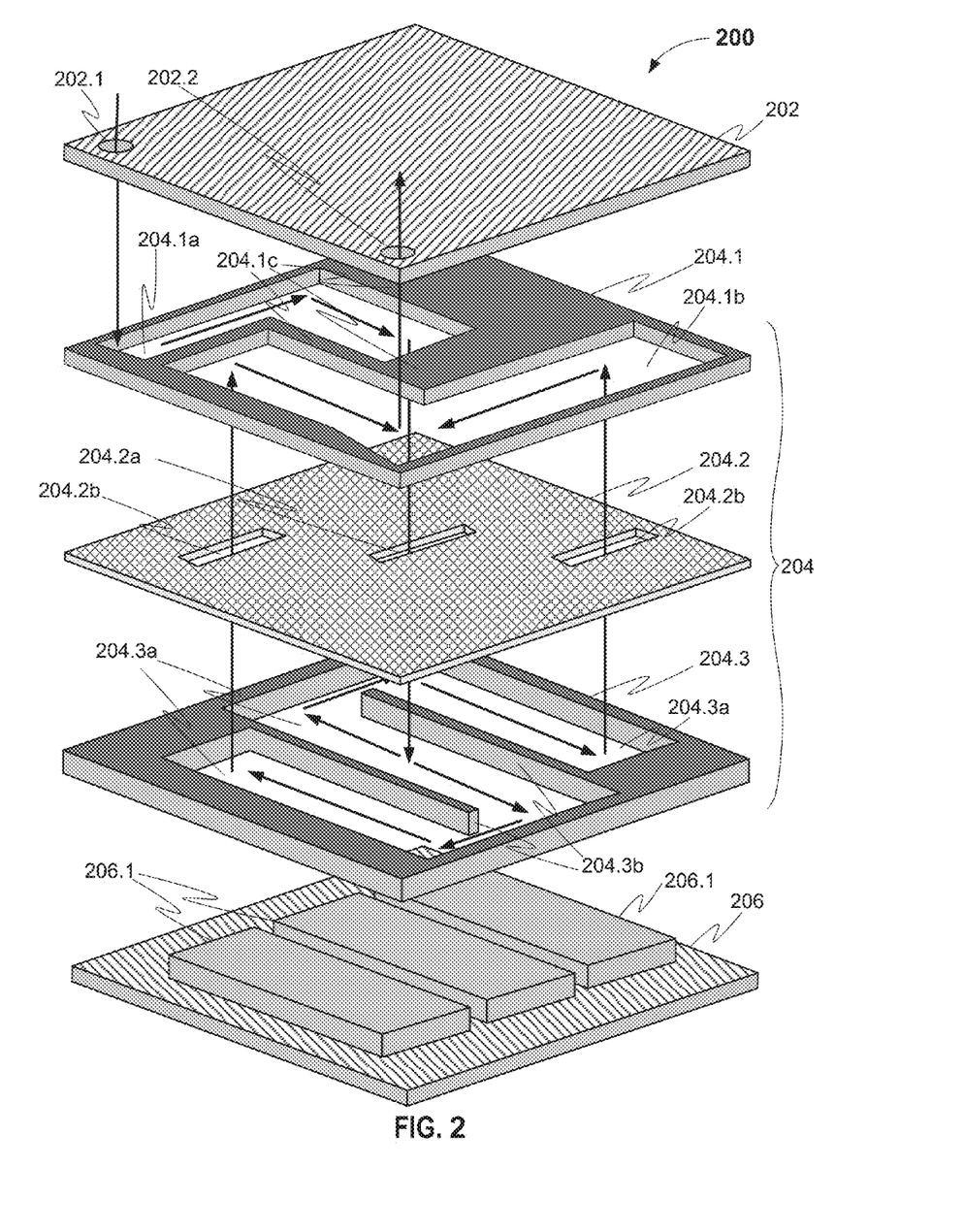
FIG. 2 schematically illustrates an exploded view of the heat exchanger with the manifold structure of the present disclosure, in accordance with some embodiments.

FIG. 2 schematically illustrates an exploded view of a heat exchanger 200 with a manifold structure 204 having multiple layers with channels and ports, in accordance with some embodiments. FIG. 2 illustrates the various layers of the manifold structure 204 of the heat exchanger ("HX") 200 in a separated form to allow description of the individual layers. In addition to the manifold structure 204, the HX 200 may include a lid plate 202 having a fluid inlet port 202.1 for a coolant fluid to enter the HX 200 and be provided to manifold structure 204, and a fluid outlet port 202.2 for the coolant fluid to return from the manifold structure 204 and exit the HX 200. The arrows shown in FIG. 2 illustrate a flow direction of the coolant fluid through the various layers of manifold structure 204 of HX 200. manifold structure In embodiments, the manifold structure 204 may include a channel layer 204.1 with an inlet flow channel 204.1a to receive a coolant fluid from the fluid inlet port 202.1 and direct the fluid along the inlet flow channel 204.1a, as shown by the arrows. The channel layer 204.1 may include an outlet flow channel 204.1b to receive the coolant fluid upon its return after passing through other portions of the manifold structure 204 of the HX 200, as illustrated by the arrows. The outlet flow channel 204.1b may direct the flow of the returning coolant fluid to the fluid outlet port 202.2, as illustrated by the arrows. Further, the channel layer 204.1 may include internal structure 204.1c to provide internal structural support to the HX 200.

The manifold structure 204 further may include a port layer 204.2 with a distributor port 204.2a to direct the coolant fluid and collection or return ports 204.2b to receive the coolant fluid upon its return after passing through portions of the manifold structure 204 of the HX 200, as illustrated by the arrows. Port layer 204.2 may also be referred to as the distribution layer, the return layer, or both.

The manifold structure 204 further may include a cooling layer 204.3 having a cooling channel 204.3a as illustrated by the arrows. The cooling channel 204.3a may receive the coolant fluid through the distributor port 204.2a of the port layer 204.2 and direct the coolant fluid along the cooling channel 204.3a to the collection ports 204.2b, as illustrated by the arrows.

The HX 200 may further include a base plate 206, formed with e.g., metal, having cooling fins 206.1, as illustrated. The metal base plate 206 may be a skived fin base plate. The cooling layer 204.3 of the manifold structure 204 may have an internal structure 204.3b, as a part of the cooling channel 204.3a, to fit between the cooling fins 206.1, as illustrated. This internal structure 204.3b of the cooling layer 204.3 may align with the internal structure 204.1c of the channel layer 204.1 to provide internal structural support to the HX 200 during a compressive load applied during mounting of the HX 200 to prevent damage to the HX 200. The cooling channel 204.3a may direct coolant fluid from a center of the cooling fins 206.1 outward and across the cooling fins 206.1, as illustrated by the arrows.

In various embodiments, the thickness of the channel layer 204.1, port layer 204.2, and cooling layer 204.3, and the geometry and/or sizes of the inlet flow channel 204.1a, cooling channel 204.3a, the outlet flow channel 204.1b, distributor port 204.2a and return ports 204.2b may be complementarily coordinated to provide and direct coolant fluid flow over the cooling fins 206.1 in a manner that is targeted for the thermal energy emanation pattern of the die 102 to be cooled, that is, of sufficient volume and/or appropriate pressure.

The HX 200 with the layers as illustrated may be manufactured from a variety of materials including metals, plastics, and composites of various types. The metal may be copper or aluminum or an alloy of copper or aluminum. The layers of HX 200 may be coupled by various methods including adhesives of various types and/or mechanical devices such as rivets or screws, for example. The layers of HX 200 may be brazed together with the lid plate 202 and metal base plate 206 to form a laminated heat exchanger structure. In an embodiment, the manifold structure 204 may be a single layer with various manifold configurations and inlet ports and outlet ports to direct flow of a coolant fluid across cooling fins 206.1. The manifold structure 204 may be formed by one or more of computer numerical control (CNC) machining, stamping, molding, 3D printing, or by one or more similar processes, for example. In alternate embodiments, there may be more layers instead.

The fluid inlet port 202.1 and the fluid outlet port 202.2 of the lid plate 202 may be placed at a different location on the HX 200. For example, the channel layer 204.1 of the manifold structure 204 may include an inlet port and/or an outlet port for a coolant fluid. Alternatively, the inlet port and the outlet port for a coolant fluid may be on the lid plate 202 and/or the channel layer 204.1. For example, an inlet port may be on the lid plate 202 and an outlet port may be on channel layer 204.1. As another example, an inlet port may be on channel layer 204.1 and an outlet port may be on lid plate 202. As another example, the inlet port may be on channel layer 204.1 and the output port may be on cooling layer 204.3, wherein the collection ports 204.2b and outlet flow channel 204.1b may not be present or required when one or more output ports are on cooling layer 204.3. The ability to have flexibility in locating the inlet port and outlet port is provided by the manifold structure 204 since this structure allows a coolant fluid to be directed as needed to the cooling fins 206.1. For example, additional distributor ports 204.2a may be located on port layer 204.2 to target hot spots. Additional flexibility is provided in locating computing devices in a package since a coolant fluid may be directed to the location of the computing devices on a package when the HX 200 is mounted to the package by appropriately aligning one or more distributor ports 204.2a. This flexibility further allows computing devices of a package to be kept at nearly the same temperature, if required, which may reduce thermal stresses on the package and increase durability of the package.

The lid plate 202, manifold structure 204, and metal base plate 206 may be designed to provide the ability of HX 200 to withstand loading associated with socketing/mounting and/or mating of a package to an HX 200 via thermal interface material (TIM). For example, the channel layer 204.1, port layer 204.2, and cooling layer 204.3 may have flow channels between support structures that allow HX 200 to withstand compression loading without any permanent deformation or causing defects to HX 200. In other words, structural integrity is maintained after socketing/mounting. This internal support, as discussed above, may be provided by internal structures 204.1c and 204.3b, as illustrated. Compression loading may be on lid plate 202 and may be transferred through the layers of HX 200 to metal base plate 206, which may be coupled to a package via TIM. For example, load bearing structure may be incorporated in the HX 200 to withstand a 250 lb load used to ensure contact with a socket by a computing device with the HX 200 coupled thereto via TIM. The load may also provide proper coupling of the heat exchanger to the computing device via the TIM. In some embodiments of HX 200, the manifold structure 204 may have sufficient structural integrity to withstand a mounting load via the perimeter structure of the manifold structure 204.

In some embodiments, one or more HX 200 may be part of a closed cooling loop. The closed cooling loop may include the one or more HX 200, conduit coupling the one or more HX 200, and a main heat exchanger or condenser to remove heat from the coolant fluid flowing through the one or more HX 200. In some embodiments, the HX 200 may allow for use of a coolant fluid where a portion of the fluid may evaporate inside a heat exchanger. The evaporated portion, the vapor, may flow to and be condensed in a separate unit, such as a condenser or some type of heat exchanger, and then the condensed vapor, now a liquid, may be reused for cooling in one or more heat exchangers, as described herein. The coolant fluid may be a dielectric fluid. For example, R134a is very commonly used in the United States for auto, household, and industrial air conditioning appliances, while in Europe, HFO 1234 yf has been accepted as a replacement to R134a. In some embodiments, the refrigerant may include 1,1,1,2-tetrafluoroethane or 2,3,3,3-tetrafluoropropene. Other refrigerants may be used.

Figure 6:
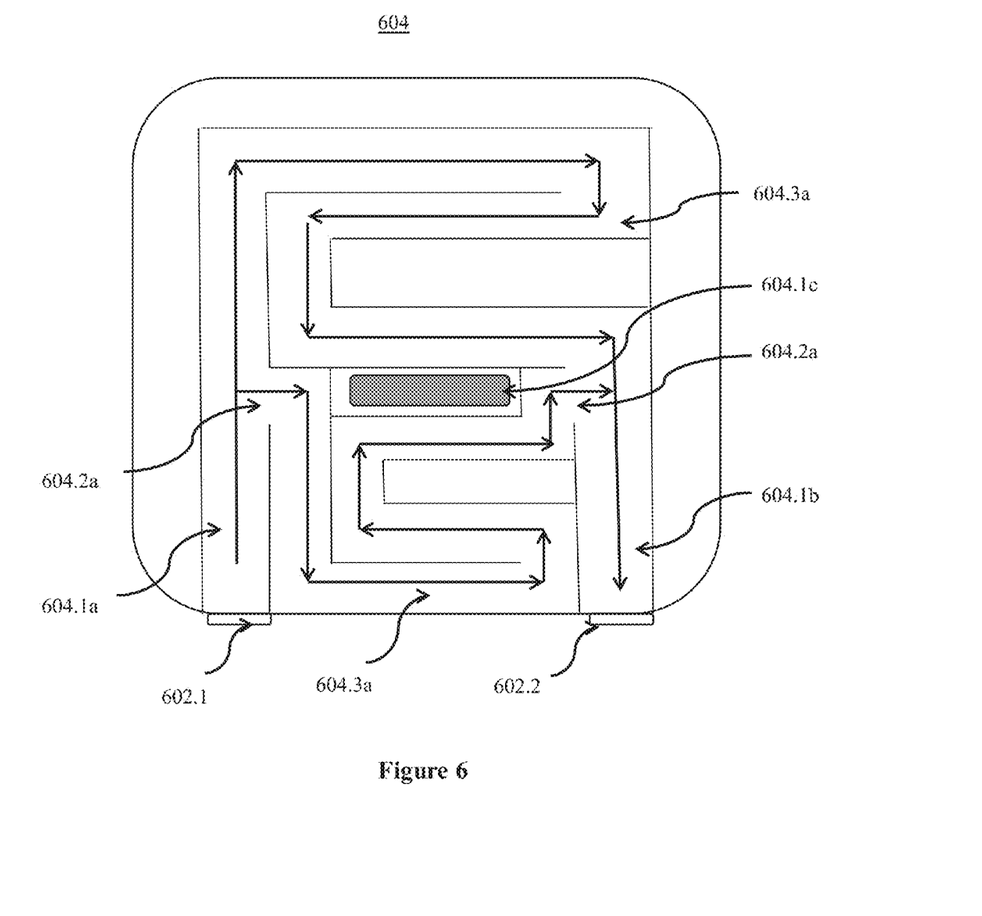
FIG. 6 illustrates an exposed top view of the manifold structure of the heat exchanger of the present disclosure, in accordance with some embodiments.

FIG. 6 illustrates an exposed to view of a manifold structure 604 of a heat exchanger, having a single layer with channels and ports, in accordance with some embodiments. As shown, similar to manifold structure 204 of FIG. 2, manifold structure 604 may include a plurality of channels 604.1a, 604.3a, and 604.1b, and ports 602.1, 604.2a, 604.2b, and 602.2 complementarily organized to distribute a coolant fluid flow tailored to a thermal energy emanation pattern of an integrated circuit package, except the channels 604.1a, 604.3a, and 604.1b, and ports 602.1 604.2a, 604.2b, and 602.2 are all complementarily organized on one layer. The channels may include an inlet flow channel 604.1a, a number of cooling channels 604.3a, and an outlet flow channels 604.1b. The ports may include distribution 604.2a and collection port 604.2b. Further, for the particular embodiments, the ports may include inlet port 602.1 and outlet port 602.2. Still further, like the manifold structure 204 of FIG. 2, internal structure 604.1c to provide internal structural support to the heat exchanger. Other embodiments are also possible.

Figure 3:
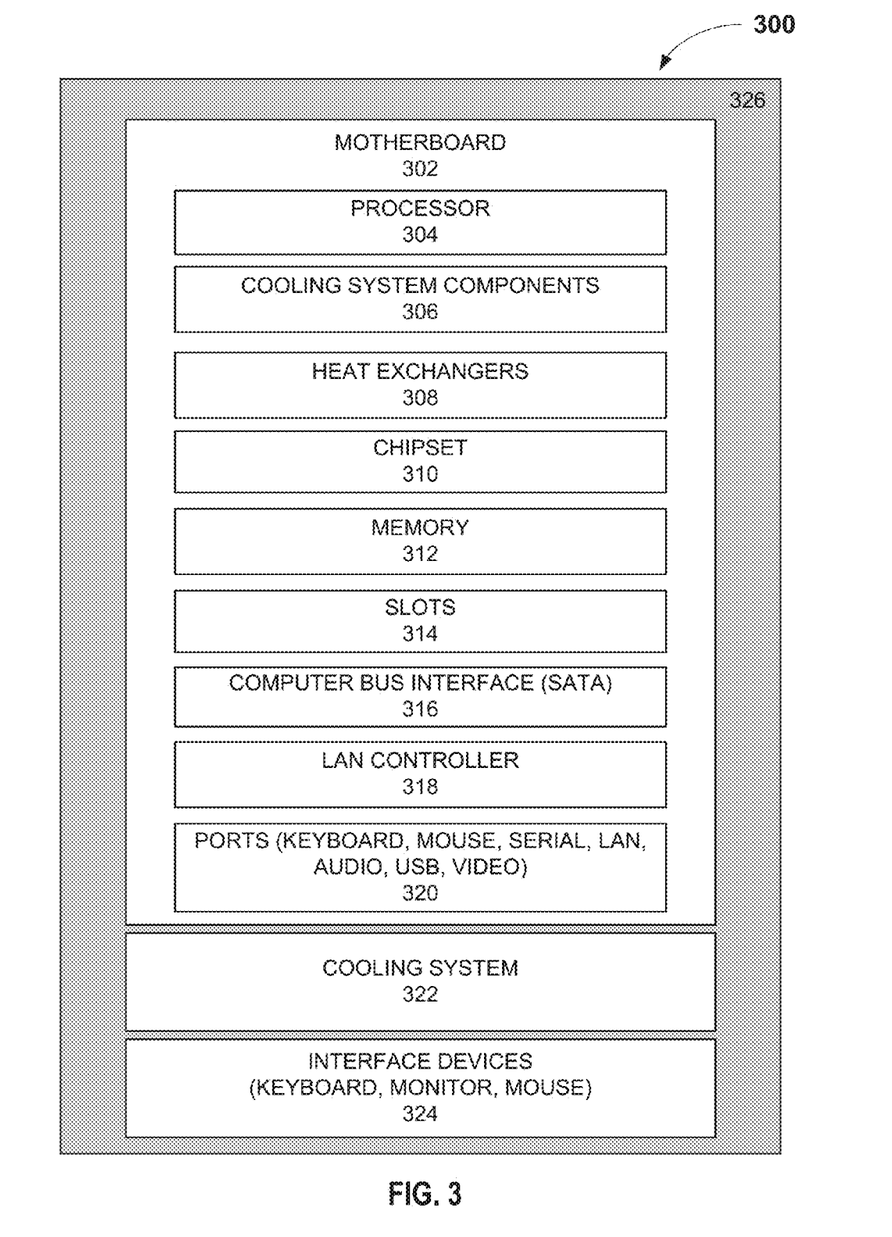
FIG. 3 schematically illustrates an apparatus for computing that includes one or more heat exchangers as described herein, in accordance with some embodiments.

Embodiments of the present disclosure may be implemented into a system using any suitable hardware and/or software to configure as desired. FIG. 3 schematically illustrates an apparatus for computing 300 that includes one or more heat exchangers as described herein, in accordance with some embodiments. The apparatus for computing 300 may house a board such as motherboard 302 (e.g., in housing 326). The motherboard 302 may include a number of components, including but not limited to a processor 304, liquid cooling system components 306, one or more heat exchangers 308, chipset 310, memory 312, slots 314, computer bus interface 316, local area network (LAN) controller 318, cooling system 322, interface devices 324, and ports 320. The chipset 310 may include a communications chip. The components may be physically and electrically coupled to the motherboard 302 and may include other components. The term "processor" may refer to any device or portion of a device that processes electronic data from registers and/or memory to transform that electronic data into other electronic data that may be stored in registers and/or memory.

In some embodiments, the cooling system components 306 may include routing for the coolant fluid and pumping devices for pumping the coolant fluid. In some embodiments, the heat exchangers 308 may be thermally coupled to various heat generating components of the apparatus for computing 300. The cooling system components 306 may be coupled to the one or more heat exchangers 308 to route the coolant fluid through the heat exchangers 308. One or more of the heat exchangers 308 may be the heat exchanger 130 described earlier.

Depending on applications, the apparatus for computing 300 may include other components that may or may not be physically and electrically coupled to the motherboard 302. These other components may include, but are not limited to, a liquid cooling system, interface devices (keyboard, display, mouse), memory, a graphics processor, a digital signal processor, a crypto processor, a chipset, a touchscreen display, a touchscreen controller, a battery, an audio codec, a video codec, a power amplifier, a speaker, a camera, and a mass storage device (such as hard disk drive, compact disk (CD), digital versatile disk (DVD), and so forth). In various implementations, the apparatus for computing 300 may be a computer system, a server, a rack server, a blade server, and a super computer system. In further implementations, the apparatus for computing 300 may be any other electronic device that processes data.

Various components of the apparatus for computing 300 shown as being comprised on the motherboard 302 are shown as an illustration of the embodiment and are not intended to be limiting.

Figure 4:
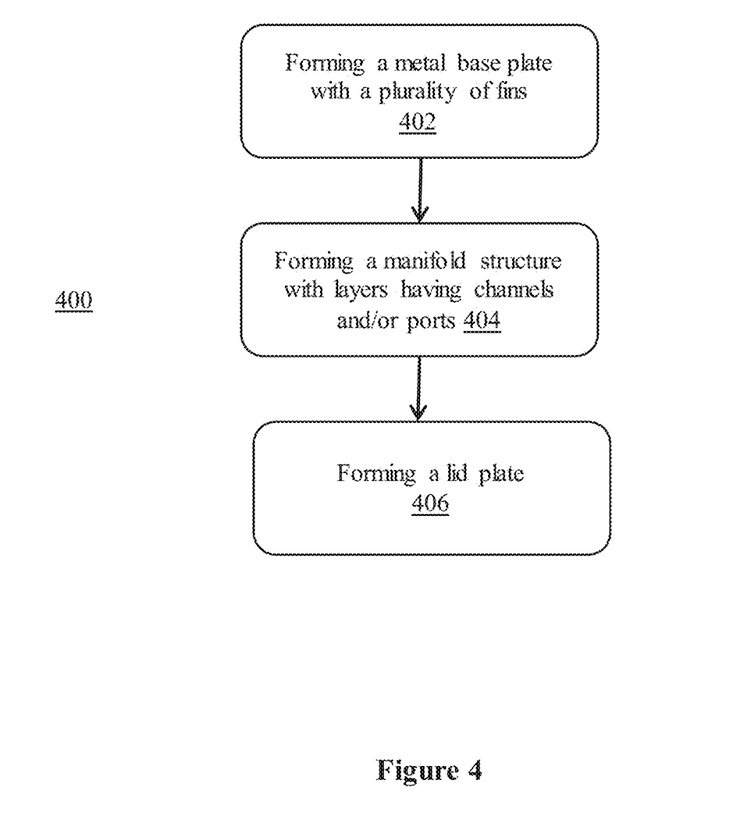
FIG. 4 schematically illustrates a method for forming a heat exchanger with the manifold structure of the present disclosure, in accordance with some embodiments.

Referring now to FIG. 4, wherein a flow chart s illustrating a process for forming a heat exchanger with the manifold structure of the present disclosure, in accordance with some embodiments, is shown. As illustrated, the process 400 for forming the heat exchanger 130 may include operations performed at blocks 402-406. At block 402, a metal base plate with a plurality of fins may be formed. Next, at block 404, a manifold structure with one or more layers having channels and ports that are complementarily organized may be formed for a targeted IC package to be cooled, on top of the metal base plate. The formation of the manifold structure may include formation of a cooling layer having one or more cooling channels, followed by a combined distribution and return layer having one or more distribution ports and one or more return ports, and then, a port layer having one or more inlet flow channels, and one or more outlet flow channels. Next, at block 406, a lid plate having at least one inlet port and at least one outlet port may be formed on top of the manifold structure. In alternate embodiments, the inlet and outlet port may be formed with one or more layers of the manifold structure.

Figure 5:
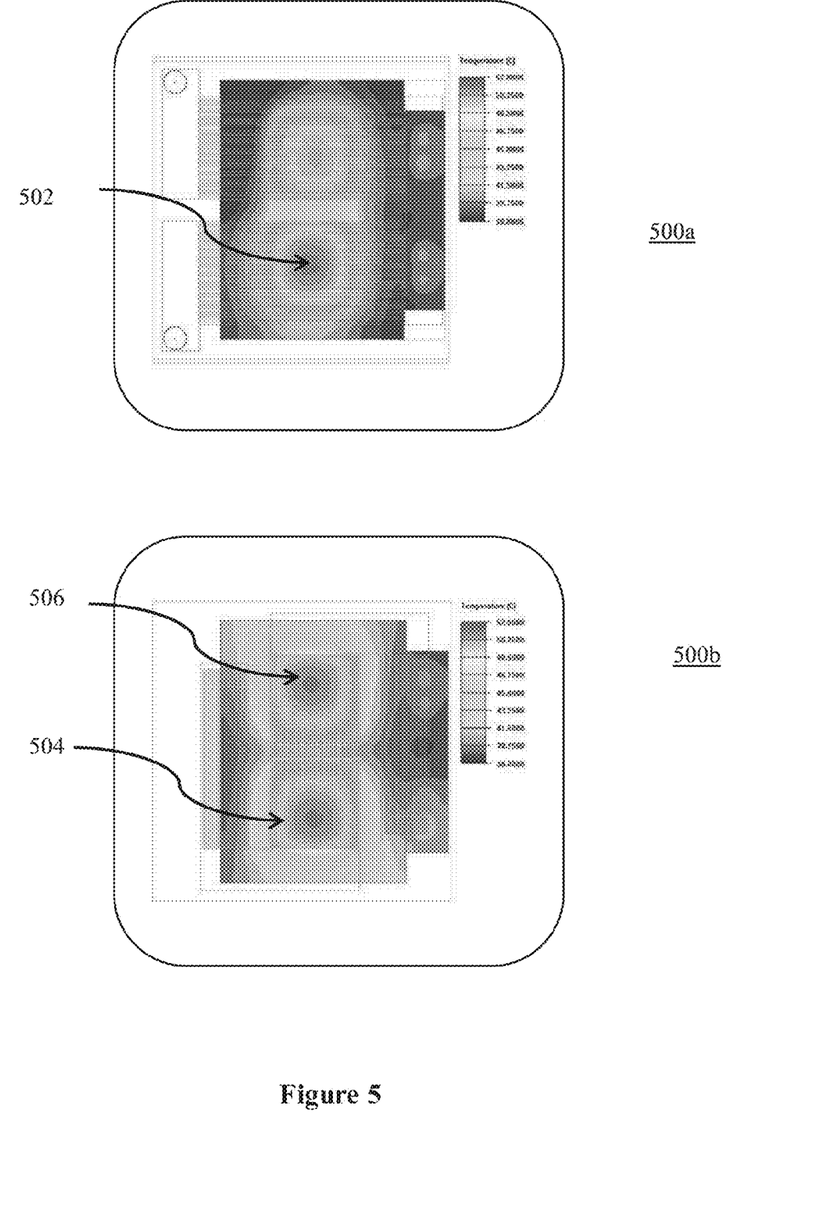
FIG. 5 shows an example temperature distribution of an integrated circuit coupled with a prior art heat exchanger and an example temperature distribution of the same integrated circuit coupled with a heat exchanger with the manifold structure of the present disclosure, in accordance with some embodiments.

Referring now to FIG. 5, wherein an example temperature distribution of an integrated circuit package coupled with a prior art heat exchanger and an example distribution of the same integrated circuit package coupled with a heat exchanger with the manifold structure of the present disclosure, in accordance with some embodiments, are shown. As illustrated, the temperature distribution 500a of the integrated circuit coupled with a prior art heat exchanger is uneven and has a hot spot 502, and whereas the temperature distribution 500b of the same integrated circuit coupled with the heat exchanger having the manifold structure of the present disclosure is more even (spread into multiple spots 504 and 506), with temperatures of the "hot spots" 504 and 506 of temperature distribution 500b lower than the temperature of the "hot spot" 502 of temperature distribution 500a.

Various operations are described as multiple discrete operations in turn, in a manner that is most helpful in understanding the claimed subject matter. However, the order of description should not be construed as to imply that these operations are necessarily order dependent.

EXAMPLES

According to various embodiments, the present disclosure describes a number of embodiments related to devices, systems, and methods for a computing apparatus with a closed cooling loop coupled to a heat exchanger. Set forth below are numerous examples and implementations of the embodiments.

Example 1 may be an heat exchanger for cooling an integrated circuit package, comprising: a base plate having a bottom side to be thermally coupled to the integrated circuit package, and a fin side opposite to the bottom side, wherein the fin side may include a plurality of fins to dissipate thermal energy emanated from the integrated circuit package; a manifold structure disposed on top of the base plate, having one or more layers, to regulate a coolant fluid flow over the plurality of fins to cool the plurality of fins, wherein the one or more layers may be configured to include a plurality of channels and ports complementarily organized to distribute the coolant fluid flow to the plurality of fins tailored to a thermal energy emanation pattern of the integrated circuit package; and a lid plate disposed on top of the manifold structure. Further, the manifold structure or the lid plate may further comprise an inlet port and an outlet port for provision and removal of the coolant fluid flow.

Example 2 may be example 1, wherein the plurality of channels and ports of the manifold structure may include one or more inlet flow channels and one or more distribution ports; wherein the one or more inlet flow channels may be configured to receive the coolant fluid from the inlet port and to direct the coolant fluid to the one or more distribution ports.

Example 3 may be example 2, wherein the one or more layers of the manifold structure may include a port layer located immediate below the lid plate, and a distribution layer located below the port layer, wherein the one or more inlet flow channels may be disposed on the port layer, and the one or more distribution ports may be disposed on the distribution layer.

Example 4 may be example 2, wherein the one or more distributor ports may be configured to direct the coolant fluid to one or more cooling channels.

Example 5 may be example 4, wherein the one or more layers of the manifold structure may include a distribution layer and a cooling layer located below the distribution layer and immediately above the base plate, wherein the one or more distribution ports may be disposed on the distribution layer, and the one or more cooling channels may be disposed on the cooling layer.

Example 6 may be example 4, wherein the plurality of channels and ports of the manifold structure may further include one or more return ports; wherein the one or more cooling channels may be configured to direct the coolant fluid to flow over the plurality of fins, and onto the one or more return ports, tailored to the thermal energy emanation pattern of the integrated circuit package.

Example 7 may be example 6, wherein the one or more layers of the manifold structure may include a cooling layer located immediately above the base plate and a return layer located above the cooling layer, wherein the one or more cooling channels may be disposed on the cooling layer, and the one or more return ports may be disposed on the return layer.

Example 8 may be example 6, wherein the plurality of channels and ports of the manifold structure may be configured to further include one or more outlet flow channels; wherein one or more return ports may be configured to direct the coolant fluid, after flowing over the plurality of fins, to the one or more outlet flow channels; and wherein the one or more outlet flow channels may be configured to direct the coolant fluid to the outlet port to remove the coolant fluid from the heat exchanger.

Example 9 may be example 8, wherein the one or more layers of the manifold structure may include a return layer, and a port layer located above the return layer and immediately below the lid plate, wherein the one or more return ports may be disposed on the return layer, and the one or more outlet flow channels may be disposed on the port layer.

Example 10 may be example 1, where the one or more layers of the manifold structure may include a port layer located immediately below the lid plate and having one or more inlet flow channels to direct flow of the coolant fluid provided through the inlet port; a combined distribution-return layer located below the port layer and having one or more distribution ports to receive the coolant fluid from the one or more inlet flow channels and distribute the coolant fluid; and a cooling layer located below the combined distribution-return layer and immediately above the base plate, and having one or more cooling channels to receive the coolant fluid from the one or more distribution ports and direct the coolant fluid to flow over the plurality of fins, tailored to the thermal energy emanation pattern of the integrated circuit package.

Example 11 may be example 10, wherein the combined distribution-return layer may further include one or more return ports to receive and direct the coolant fluid after flowing over the plurality of fins, and the port layer may further include one or more outlet flow channels to receive the coolant fluid from the one or more return ports, and direct the coolant fluid to the outlet port.

Example 12 may be example 10, wherein the port layer may further include one or more structural members to contribute to strengthen the heat exchanger to support a predetermined amount of load.

Example 13 may be example 10 or 12, wherein the cooling layer may further include one or more structural members to contribute to strengthen the heat exchanger to support a predetermined amount of load.

Example 14 may be any one of examples 1-11, wherein the one or more layers of the manifold structure may include structural members disposed on one or more of the one or more layers to strengthen the heat exchanger to support a predetermined amount of load.

Example 15 may be example 14, wherein thickness of the one or more layers, and geometry or size of the channels or ports are complementarily organized, tailored to the thermal energy emanation pattern of the integrated circuit package.

Example 16 may be a method for forming a heat exchanger for cooling an integrated circuit package; comprising: forming a metal base plate having a bottom side to be thermally coupled to the integrated circuit package, and a fin side opposite to the bottom side, wherein the fin side may include a plurality of fins to dissipate thermal energy emanated from the integrated circuit package; forming a manifold structure on top of the metal base plate, having one or more layers, to regulate a coolant fluid flow over the plurality of fins to cool the plurality of fins, wherein the layers may include a plurality of channels and ports complementarily organized to distribute the coolant fluid flow to the plurality of fins tailored to a thermal energy emanation pattern of the integrated circuit package; and forming a lid plate on top of the manifold structure. Further, forming a manifold structure or forming a lid plate may include forming an inlet port and an outlet port for provision and removal of the coolant fluid flow.

Example 17 may be example 16, wherein forming the manifold structure may include forming the plurality of channels and ports of the manifold structure to include one or more inlet flow channels and one or more distribution ports; wherein the one or more inlet flow channels may be configured to receive the coolant fluid from the inlet port and to direct the coolant fluid to the one or more distribution ports.

Example 18 may be example 17, wherein forming the manifold structure may include forming the one or more layers of the manifold structure to include a port layer located immediate below the lid plate, and a distribution layer located below the port layer, wherein the one or more inlet flow channels may be disposed on the port layer, and the one or more distribution ports may be disposed on the distribution layer.

Example 19 may be example 17, wherein forming the manifold structure may include forming the one or more distributor ports to direct the coolant fluid to one or more cooling channels.

Example 20 may be example 19, wherein forming the manifold structure may include forming the one or more layers of the manifold structure to include a distribution layer and a cooling layer located below the distribution layer and immediate above the metal base plate, wherein the one or more distribution ports may be disposed on the distribution layer, and the one or more cooling channels may be disposed on the cooling layer.

Example 21 may be example 19, wherein forming the manifold structure may include forming the plurality of channels and ports of the manifold structure to further include one or more return ports; wherein the one or more cooling channels may be configured to direct the coolant fluid to flow over the plurality of fins, and onto the one or more return ports, tailored to the thermal energy emanation pattern of the integrated circuit package.

Example 22 may be example 21, wherein forming the manifold structure may include forming the one or more layers of the manifold structure to include a cooling layer located immediate above the metal base plate and a return layer located above the cooling layer, wherein the one or more cooling channels may be disposed on the cooling layer, and the one or more return ports may be disposed on the return layer.

Example 23 may be example 21, wherein forming the manifold structure may include forming the plurality of channels and ports of the manifold structure to further include one or more outlet flow channels; wherein the one or more return ports may be configured to direct the coolant fluid, after flowing over the plurality of fins, to the one or more outlet flow channels; and wherein the one or more outlet flow channels may be configured to direct the coolant fluid to the outlet port to remove the coolant fluid from the heat exchanger.

Example 24 may be example 23, wherein forming the manifold structure may include forming the one or more layers of the manifold structure to include a return layer, and a port layer located above the return layer and immediately below the lid plate, wherein the one or more return ports may be disposed on the return layer, and the one or more outlet flow channels may be disposed on the port layer.

Example 25 may be example 16, where forming the one or more layers of the manifold structure may include forming a port layer located immediately below the lid plate and having one or more inlet flow channels to direct flow of the coolant fluid provided through the inlet port; a combined distribution-return layer located below the port layer and having one or more distribution ports to receive the coolant fluid from the one or more inlet flow channels and distribute the coolant fluid; and a cooling layer located below the combined distribution-return layer and immediately above the metal base plate, and having one or more cooling channels to receive the coolant fluid from the first one or more distribution ports and direct the coolant fluid to the plurality of fins, tailored to the thermal energy emanation pattern of the integrated circuit package.

Example 26 may be example 25, wherein forming the combined distribution-return layer may further include forming one or more return ports to receive and direct the coolant fluid after flowing over the plurality of fins, and the port layer to further include one or more outlet flow channels to receive the coolant fluid from the one or more return ports, and direct the coolant fluid to the outlet port.

Example 27 may be example 25, wherein forming the manifold structure may include forming the port layer to further include one or more structural members to contribute to strengthen the heat exchanger to support a predetermined amount of load.

Example 28 may be example 25 or 27, wherein forming the manifold structure may include forming the cooling layer to further include one or more structural members to contribute to strengthen the heat exchanger to support a predetermined amount of load.

Example 29 may be any one of examples 16-26, wherein forming the manifold structure may include forming the one or more layers of the manifold structure to include structural members disposed on one or more of the one or more layers to strengthen the heat exchanger to support a predetermined amount of load.

Example 30 may be example 29, wherein the predetermined amount of load may be up to 250 pounds.

Example 31 may be an apparatus for computing, including cooling of the apparatus; comprising: a die having computational circuitry; and a heat exchanger thermally coupled with the die to cool the die, wherein the heat exchanger may include: a base plate having a bottom side to be thermally coupled to the die, and a fin side opposite to the bottom side, wherein the fin side may include a plurality of fins to dissipate thermal energy emanated from the die; means for regulating a coolant fluid flow over the plurality of fins to cool the plurality of fins, including one or more layers having means for distributing the coolant fluid flow to the plurality of fins tailored to a thermal energy emanation pattern of the die; and a lid plate on top of the regulating means. Further, either the regulating means or the lid plate may further comprise an inlet port and an outlet port for provision and removal of the coolant fluid flow.

Example 32 may be example 31, wherein the distributing means may include one or more inlet flow channels and one or more distribution ports; wherein the one or more inlet flow channels may be configured to receive the coolant fluid from the inlet port and to direct the coolant fluid to the one or more distribution ports.

Example 33 may be example 32, wherein the one or more layers of the regulating means may include a port layer located immediate below the lid plate, and a distribution layer located below the port layer, wherein the one or more inlet flow channel may be disposed on the port layer, and the one or more distribution ports may be disposed on the distribution layer.

Example 34 may be example 32, wherein the one or more distributor ports may direct the coolant fluid to one or more cooling channels.

Example 35 may be example 34, wherein the one or more layers of the regulating means may include a distribution layer and a cooling layer located below the distribution layer and immediate above the base plate, wherein the one or more distribution ports may be disposed on the distribution layer, and the one or more cooling channels may be disposed on the cooling layer.

Example 36 may be example 34, wherein the distribution means may further include one or more return ports; wherein the one or more cooling channels may be configured to direct the coolant fluid to flow over the plurality of fins, and onto the one or more return ports, tailored to the thermal energy emanation pattern of the die.

Example 37 may be example 36, wherein the one or more layers of the regulating means may include a cooling layer located immediate above the base plate and a return layer located above the cooling layer, wherein the one or more cooling channels may be disposed on the cooling layer, and the one or more return ports may be disposed on the return layer.

Example 38 may be example 36, wherein the distribution means may further include one or more outlet flow channels; wherein the one or more return ports may be configured to direct the coolant fluid, after flowing over the plurality of fins, to the one or more outlet flow channels; and wherein the one or more outlet flow channels may be configured to direct the coolant fluid to the outlet port to remove the coolant fluid from the heat exchanger.

Example 39 may be example 38, wherein the one or more layers of the regulating means may include a return layer, and a port layer located above the return layer and immediately below the lid plate, wherein the one or more return ports may be disposed on the return layer, and the one or more outlet flow channels may be disposed on the port layer.

Example 40 may be example 31, where the one or more layers of the regulating means may include a port layer located immediately below the lid plate and having one or more inlet flow channels to direct flow of the coolant fluid provided through the inlet port; a combined distribution-return layer located below the port layer and having one or more distribution ports to receive the coolant fluid from the one or more inlet flow channels and distribute the coolant fluid; and a cooling layer located below the combined distribution-return layer and immediately above the base plate, and having one or more cooling channels to receive the coolant fluid from the first one or more distribution ports and direct the coolant fluid to the plurality of fins, tailored to the thermal energy emanation pattern of the die.

Example 41 may be example 40, wherein the combined distribution-return layer may further include one or more return ports to receive and direct the coolant fluid after flowing over the plurality of fins, and the port layer may further include one or more outlet flow channels to receive the coolant fluid from the one or more return ports, and direct the coolant fluid to the outlet port.

Example 42 may be example 41, wherein the port layer may further include one or more structural members to contribute to strengthen the heat exchanger to support a predetermined amount of load.

Example 43 may be example 40 or 42, wherein the cooling layer may further include one or more structural members to contribute to strengthen the heat exchanger to support a predetermined amount of load.

Example 44 may be any one of examples 31-41, wherein the one or more layers of the regulating means may include structural members disposed on one or more of the plurality of layers to strengthen the heat exchanger to support a predetermined amount of load.

Example 45 may be any one of examples 31-41, wherein the die may comprise a multi-core processor, or the apparatus is a selected one of a computing server, a networking router, a networking switch, a network gateway, or a computer-readable mass storage device.

The foregoing description of one or more implementations provides illustration and description, but is not intended to be exhaustive or to limit the scope of the embodiments to the precise form disclosed or claimed herein. Modifications and variations are possible in light of the above teachings or may be acquired from practice of various implementations of the various embodiments. Future improvements, enhancements, or changes to particular components, methods, or means described in the various embodiments are contemplated to be within the scope of the claims and embodiments described herein, as would readily be understood by a person having ordinary skill in the art.

What is claimed is:

1. A heat exchanger for cooling an integrated circuit package, comprising:

a base plate having a bottom side to be thermally coupled to the integrated circuit package, and a fin side opposite to the bottom side, wherein the fin side is to include a plurality of fins to dissipate thermal energy emanated from the integrated circuit package;

a manifold structure disposed on top of the base plate, having one or more layers, to regulate a coolant fluid flow over the plurality of fins to cool the plurality of fins, wherein the one or more layers are to include a plurality of channels and ports complementarily organized to distribute the coolant fluid flow to the plurality of fins tailored to a thermal energy emanation pattern of the integrated circuit package; and a lid plate disposed on top of the manifold structure;

wherein either the manifold structure or the lid plate further comprises an inlet port and an outlet port for provision and removal of the coolant fluid flow;

wherein the plurality of channels and ports of the manifold structure includes one or more inlet flow channels and one or more distribution ports; wherein the one or more inlet flow channels are to receive the coolant fluid from the inlet port and to direct the coolant fluid to the one or more distribution ports.

2. The heat exchanger of claim 1, wherein the one or more layers of the manifold structure include a port layer located immediately below the lid plate, and a distribution layer located below the port layer, wherein the one or more inlet flow channels are disposed on the port layer, and the one or more distribution ports are disposed on the distribution layer.

3. The heat exchanger of claim 1, wherein the one or more distribution ports are to direct the coolant fluid to one or more cooling channels.

4. The heat exchanger of claim 3, wherein the one or more layers of the manifold structure include a distribution layer and a cooling layer located below the distribution layer and immediately above the base plate, wherein the one or more distribution ports are disposed on the distribution layer, and the one or more cooling channels are disposed on the cooling layer.

5. The heat exchanger of claim 3, wherein the plurality of channels and ports of the manifold structure further includes one or more return ports; wherein the one or more cooling channels are to direct the coolant fluid to flow over the plurality of fins, and onto the one or more return ports, tailored to the thermal energy emanation pattern of the integrated circuit package.

6. The heat exchanger of claim 5, wherein the one or more layers of the manifold structure include a cooling layer located immediately above the base plate and a return layer located above the cooling layer, wherein the one or more cooling channels are disposed on the cooling layer, and the one or more return ports are disposed on the return layer.

7. The heat exchanger of claim 5, wherein the plurality of channels and ports of the manifold structure are to further include one or more outlet flow channels; wherein one or more return ports are to direct the coolant fluid, after flowing over the plurality of fins, to the one or more outlet flow channels; and wherein the one or more outlet flow channels are to direct the coolant fluid to the outlet port to remove the coolant fluid from the heat exchanger.

8. The heat exchanger of claim 7, wherein the one or more layers of the manifold structure include a return layer, and a port layer located above the return layer and immediately below the lid plate, wherein the one or more return ports are disposed on the return layer, and the one or more outlet flow channels are disposed on the port layer.

9. A heat exchanger for cooling an integrated circuit package, comprising:

a base plate having a bottom side to be thermally coupled to the integrated circuit package, and a fin side opposite to the bottom side, wherein the fin side is to include a plurality of fins to dissipate thermal energy emanated from the integrated circuit package;

a manifold structure disposed on top of the base plate, having one or more layers, to regulate a coolant fluid flow over the plurality of fins to cool the plurality of fins, wherein the one or more layers are to include a plurality of channels and ports complementarily organized to distribute the coolant fluid flow to the plurality of fins tailored to a thermal energy emanation pattern of the integrated circuit package; and a lid plate disposed on top of the manifold structure;

wherein either the manifold structure or the lid plate further comprises an inlet port and an outlet port of provision and removal of the collant fluid flow;

where the one or more layers of the manifold structure include a port layer located immediately below the lid plate and having one or more inlet flow channels to direct flow of the coolant fluid provided through the inlet port; a combined distribution-return layer located below the port layer and having one or more distribution ports to receive the coolant fluid from the one or more inlet flow channels and distribute the coolant fluid; and a cooling layer located below the combined distribution-return layer and immediately above the base plate, and having one or more cooling channels to receive the coolant fluid from the one or more distribution ports and direct the coolant fluid to flow over the plurality of fins, tailored to the thermal energy emanation pattern of the integrated circuit package.

10. The heat exchanger of claim 9, wherein the combined distribution-return layer further includes one or more return ports to receive and direct the coolant fluid after flowing over the plurality of fins, and the port layer further includes one or more outlet flow channels to receive the coolant fluid from the one or more return ports, and direct the coolant fluid to the outlet port.

11. The heat exchanger of claim 9, wherein the port layer further includes one or more structural members to contribute to strengthen the heat exchanger to support a predetermined amount of load.

12. The heat exchanger of claim 9, wherein the cooling layer further includes one or more structural members to contribute to strengthen the heat exchanger to support a predetermined amount of load.

13. The heat exchanger of claim 9, wherein the one or more layers of the manifold structure includes structural members disposed on one or more of the one or more layers to strengthen the heat exchanger to support a predetermined amount of load.

14. The heat exchanger of claim 13, wherein thickness of the one or more layers, and geometry or size of the channels or ports are complementarily organized, tailored to the thermal energy emanation pattern of the integrated circuit package.

15. An apparatus for computing, including cooling of the apparatus;

comprising:
a die having computational circuitry; and
a heat exchanger thermally coupled with the die to cool the die, wherein the heat exchanger includes:
a base plate having a bottom side to be thermally coupled to the die, and a fin side opposite to the bottom side, wherein the fin side is to include a plurality of fins to dissipate thermal energy emanated from the die;

a manifold structure disposed on top of the base plate, having one or more layers, to regulate a coolant fluid flow over the plurality of fins to cool the plurality of fins, including one or more layers having a plurality of channels and ports complementarily organized to distribute the coolant fluid flow to the plurality of fins tailored to a thermal energy emanation pattern of the die; and a lid plate on top of the manifold structure;

wherein either the manifold structure or the lid plate further comprises an inlet port and an outlet port for provision and removal of the coolant fluid flow;

wherein the plurality of channels and ports of the manifold structure includes one or more inlet flow channels and one of more distribution ports; wherein the one or more inlet flow channels are to receive the coolant fluid from the inlet port and to direct the coolant fluid to the one or more distribution ports.

16. The apparatus of claim 15, where the one or more layers of the manifold structure includes a port layer located immediately below the lid plate and having one or more inlet flow channels to direct flow of the coolant fluid provided through the inlet port; a combined distribution-return layer located below the port layer and having one or more distribution ports to receive the coolant fluid from the one or more inlet flow channels and distribute the coolant fluid; and a cooling layer located below the combined distribution-return layer and immediately above the base plate, and having one or more cooling channels to receive the coolant fluid from the first one or more distribution ports and direct the coolant fluid to the plurality of fins, tailored to the thermal energy emanation pattern of the die.

17. The apparatus of claim 15, wherein the one or more layers of the manifold structure include structural members disposed on one or more of the one or more layers to strengthen the heat exchanger to support a predetermined amount of load.

18. The apparatus of claim 15, further comprising a printed circuit board; wherein the die comprises a multi-core processor, and is disposed on the printed circuit board.

* * * * *